United States Patent
Hatem et al.

(10) Patent No.: US 9,953,835 B2
(45) Date of Patent: Apr. 24, 2018

(54) DAMAGE FREE ENHANCEMENT OF DOPANT DIFFUSION INTO A SUBSTRATE

(71) Applicant: Varian Semiconductor Equipment Associates, Inc., Gloucester, MA (US)

(72) Inventors: Christopher R. Hatem, Seabrook, NH (US); Christopher A. Rowland, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/412,837

(22) Filed: Jan. 23, 2017

(65) Prior Publication Data

US 2017/0178908 A1    Jun. 22, 2017

Related U.S. Application Data (63) Continuation of application No. 14/977,849, filed on Dec. 22, 2015, now Pat. No. 9,589,802.

(51) Int. Cl.

| | |
|---|---|
| H01L 21/265 | (2006.01) |
| H01L 21/225 | (2006.01) |
| H01L 21/324 | (2006.01) |
| H01L 29/66 | (2006.01) |
| H01L 21/67 | (2006.01) |
| H01L 21/8234 | (2006.01) |
| H01L 21/223 | (2006.01) |

(52) U.S. Cl.
CPC .......... H01L 21/225 (2013.01); H01L 21/223 (2013.01); H01L 21/265 (2013.01); H01L 21/324 (2013.01); H01L 21/67213 (2013.01); H01L 21/823431 (2013.01); H01L 29/66803 (2013.01)

(58) Field of Classification Search
CPC ......... H01L 21/02296; H01L 21/02365; H01L 21/02518; H01L 21/38; H01L 21/383; H01L 21/46; H01L 21/64; H01L 21/70
See application file for complete search history.

(56) References Cited

U.S. PATENT DOCUMENTS

| | | |
|---|---|---|
| 3,718,502 A | 2/1973 | Gibbons |
| 2002/0098713 A1 | 7/2002 | Henley et al. |
| 2006/0234486 A1 | 10/2006 | Speck et al. |
| 2006/0255341 A1* | 11/2006 | Pinnington ............ B82Y 20/00 257/79 |
| 2008/0064182 A1* | 3/2008 | Hebras ............... H01L 21/76254 438/455 |

(Continued)

FOREIGN PATENT DOCUMENTS

JP    2013048247 A    3/2013

OTHER PUBLICATIONS

International Search Report and Written Opinion dated Apr. 26, 2017 for PCT/US2016/063841 Filed Nov. 28, 2016.

*Primary Examiner* — Cheung Lee (57) ABSTRACT

A method of doping a substrate. The method may include implanting a dose of a helium species into the substrate through a surface of the substrate at an implant temperature of 300° C. or greater. The method may further include depositing a doping layer containing a dopant on the surface of the substrate, and annealing the substrate at an anneal temperature, the anneal temperature being greater than the implant temperature.

18 Claims, 5 Drawing Sheets

(56) References Cited

U.S. PATENT DOCUMENTS

2009/0162966 A1* 6/2009 Jawarani ......... H01L 31/022425
438/67
2015/0056793 A1 2/2015 Segalman et al.
2016/0372327 A1 12/2016 Ventzek et al.

* cited by examiner

DAMAGE FREE ENHANCEMENT OF DOPANT DIFFUSION INTO A SUBSTRATE

CROSS-REFERENCE TO RELATED APPLICATION

This application claims priority to, and is a continuation of U.S. patent application Ser. No. 14/977,849, filed Dec. 22, 2015, entitled "DAMAGE FREE ENHANCEMENT OF DOPANT DIFFUSION INTO A SUBSTRATE" and incorporated by reference herein it its entirety.

FIELD

The present embodiments relate to methods of improving diffusion, and more particularly to methods of doping a substrate.

BACKGROUND

As semiconductor devices such as logic and memory devices continue to scale to smaller dimensions, the use of conventional processing and materials to fabricate semiconductor devices is increasingly problematic. In one example, new approaches for doping semiconductor structures are being investigated to supplant ion implantation. For example, in doping device structures where the smallest device dimensions are on the order of 20 nm or below, residual damage caused by ion implantation may be unacceptable. Accordingly, techniques such as doping a target region of a substrate by thermally-driven outdiffusion from a deposited layer have been explored. As currently practiced, this approach may be limited due to thermal budget considerations in the amount of dopant incorporated into the target region as well as the activation of dopant.

With respect to these and other considerations the present disclosure has been provided.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method of doping a substrate may include implanting a dose of a helium species into the substrate through a surface of the substrate at an implant temperature of 300° C. or greater. The method may further include depositing a doping layer containing a dopant on the surface of the substrate; and annealing the substrate at an anneal temperature, the anneal temperature being greater than the implant temperature.

In another embodiment, a method of doping a semiconductor device may include implanting a dose of helium into a substrate through a surface of the substrate at an implant temperature above 300° C., the dose of helium comprising $5E15/cm^2$ or greater. The method may further include depositing a doping layer containing a dopant on the surface of the substrate, the doping layer having a thickness less than 1 nm; and annealing the substrate at an anneal temperature greater than 600° C.

In another embodiment, a system for doping a substrate may include a transfer chamber to house and transfer a substrate; a hot implant chamber coupled to a helium source and coupled to the transfer chamber. The hot implant chamber may include a plasma generator generating helium ions, and a substrate heater generating a substrate temperature of 300° C. or more. The system may further include a dopant deposition chamber coupled to a dopant source and to the transfer chamber, the dopant deposition chamber providing dopant to the substrate. The system may also include an annealing chamber coupled to the transfer chamber and having a heater generating a substrate temperature of at least 600° C.

BRIEF DESCRIPTION OF THE DRAWINGS

FIG. 4A shows general features of a finFET device in cross section, while

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In the present embodiments, the present inventors have identified novel approaches to promote dopant diffusion into a substrate without damage to the substrate. In various embodiments, a dose of helium may be implanted into a substrate when the substrate is at an implantation temperature in a temperature range above room temperature. The dose of helium may be provided in conjunction with deposition of a dopant material on the substrate in a manner resulting in improved diffusion of the dopant into the substrate, activation of the dopant within the substrate, while not generating residual defects within the substrate, resulting in a damage-free enhancement of diffusion.

Figure 1A:
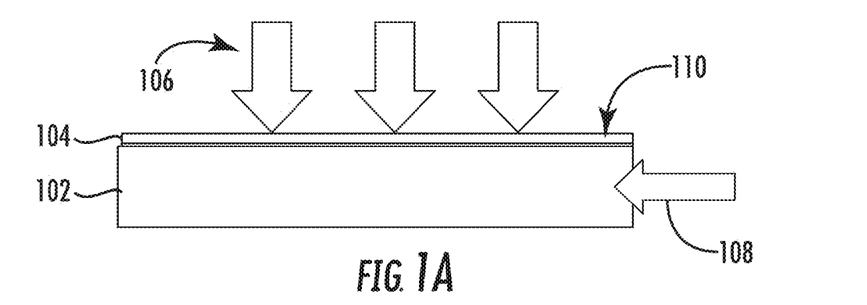
FIGS. 1A-1H illustrate exemplary features involved in processing a substrate according to embodiments of the disclosure.

FIGS. 1A-1H illustrate exemplary features involved in processing a substrate according to embodiments of the disclosure. In some embodiments, the operations illustrated in FIGS. 1A-1F may be performed in different processing tools, while in other embodiments, the operations may be performed within a given integrated tool having multiple process chambers to perform different operations, such as a cluster tool. Turning in particular to FIG. 1A, there is shown a first instance where a substrate 102 is provided. In various embodiments, the substrate 102 may be a semiconductor material, such as silicon, germanium, silicon carbide (SiC), or a silicon:germanium alloy. In other embodiments, the substrate may comprise a known group III-V compound semiconductor (e.g., GaAs, InGaAs) or group II-VI compound semiconductor (e.g., CdTe). In particular, the substrate 102 may generally have a monocrystalline structure characterized by a crystalline lattice as known in the art. The embodiments are not limited in this context. While the substrate 102 is shown as having a planar configuration, in various embodiments, the substrate 102 may include features presenting surfaces extending at different angles with respect to one another, such as a three dimensional (3D) transistor device. Examples of 3D devices include fin field effect transistor devices (finFET), gate-all-around (GAA) transistor devices, horizontal GAA devices (HGAA), and other devices. The embodiments are not limited in this context. In the example of FIGS. 1A-1F, doping of a particular region of the substrate 102. In different embodiments, the doping operations may be representative of an isolation region of a transistor, a source/drain extension region, or a source/drain contact region, to name a few regions.

As shown in FIG. 1A, the substrate 102 may include a surface layer 104 to be removed before doping. The surface layer 104 may be a native oxide or chemical oxide layer in some instances. In various embodiments, the surface layer 104 is exposed to an etchant 106. In one example, the etchant 106 represents species obtained from a hydrogen plasma, where the etchant impinges upon the substrate 102 while the substrate 102 is held at low pressure. Heat 108 may be applied to the substrate 102 to elevate the substrate temperature to a target range to promote etching of the surface layer 104. In one example for etching an oxide layer on a silicon substrate, the substrate 102 may be subject to etching by a hydrogen plasma at a substrate temperature between 400° C. and 500° C., and in particular, at a substrate temperature of 450° C. The duration of the exposure may be adequate to remove the surface layer 104. In other embodiments, other known etchants for etching an oxide may be employed.

Figure 1B:
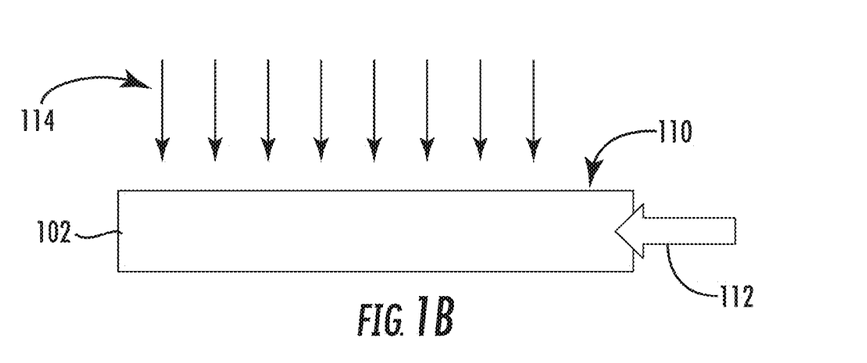

Turning now to FIG. 1B, there is shown an implantation operation, where the implantation operation may be performed subsequently to the operation shown in FIG. 1A. In some examples, the implantation operation is performed after the etch operation of FIG. 1A, while the substrate 102 is not exposed to ambient atmosphere between the operations of FIG. 1A and FIG. 1B. In various embodiments, the substrate 102 is exposed to helium species 114, where the helium species 114 are directed to the surface 110. In this example, the surface 110 may be exposed after the removal of the surface layer 104. The helium species 114 may be directed to the surface 110 of substrate 102 at a target energy and target dose to promote a subsequent doping process. The helium species 114 may, for example, comprise helium ions having an energy of 500 eV to 5000 eV, and may be directed to the substrate 102 in a dose comprising $5E15/cm^2$ to $1E17/cm^2$ He. The embodiments are not limited in this context.

As further shown in FIG. 1B, heat 112 may be supplied to the substrate 102 during exposure to the helium species 114. In various embodiments, the helium species 114 are implanted into the substrate 102 through surface 110, while the substrate 102 is heated to maintain an implant temperature above room temperature (25° C.). For example, in various embodiments, the implant temperature may range above 300° C. and may, in particular, range between 300° C. and 600° C. In particular embodiments, the implant temperature may be set in a range between approximately 400° C. and approximately 500° C. The embodiments are not limited in this context.

Figure 1C:
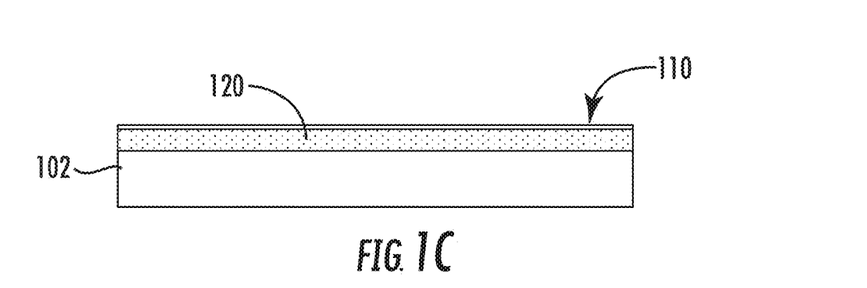

Turning now to FIG. 1C, there is shown an instance of the substrate 102 after the operation of FIG. 1B. An altered layer 120 may be formed in the substrate 102 adjacent the surface 110. As detailed below, the altered layer 120 may enhance doping of the substrate 102 by promoting dopant diffusion across the surface 110. In particular, the altered layer 120 may enhance doping of the substrate without introducing residual damage into the substrate after a doping process is complete.

Figure 1D:
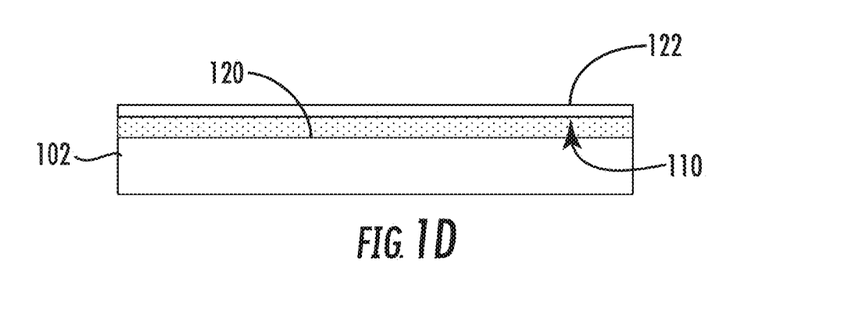

Turning now to FIG. 1D, there is shown an operation where a doping layer 122 is deposited on the surface 110 of the substrate 102. In this example, the doping layer 122 is deposited after the altered layer 120 is formed, while in some embodiments, the doping layer 122 may be deposited before the implantation of helium is performed to create the altered layer 120. In various embodiments, the doping layer 122 may be formed on the substrate 102 after the implantation of helium without exposing the substrate 102 to ambient atmosphere. The doping layer 122 may include an appropriate dopant for doping the substrate 102, such as arsenic, boron, phosphorous, or silicon. The embodiments are not limited in this context. The doping layer 122 may be deposited using known techniques such as chemical vapor deposition. The doping layer 122 may be deposited at an appropriate thickness for creating a target doped region within the substrate 102. In some embodiments, the doping layer 122 may have a thickness of between 0.1 nm and 3 nm. The embodiments are not limited in this context. As an example, a 0.1 nm thick layer of As may be useful to dope a target region of the substrate 102, such as a 10 nm thick region, to an appropriate level.

Figure 1E:
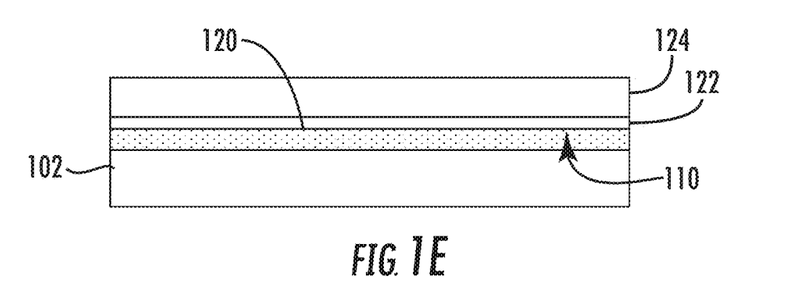

Turning now to FIG. 1E, there is shown an operation subsequent to the operation of FIG. 1D. In this operation, a capping layer 124 is deposited on the doping layer 122. The capping layer 124 may be useful to aid in dopant retention during subsequent processing performed to drive in dopant from the doping layer 122 and to activate the dopant. The capping layer 124 may be formed of a material appropriate for use during high temperature dopant annealing, as known in the art, such as silicon nitride. The capping layer 124 may be deposited at room temperature, for example, to minimize dopant movement before subsequent processing. In some examples, the capping layer 124 may be formed after formation of the doping layer 122 without exposing the substrate 102 to ambient atmosphere in the meantime.

Figure 1F:
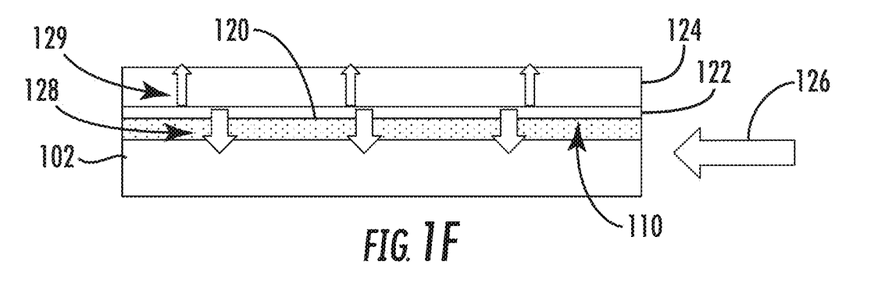

Turning now to FIG. 1F, there is shown a subsequent operation where the substrate 102 is subject to high temperature annealing to drive in the dopant and activate the dopant of doping layer 122. This is shown schematically by the provision of heat 126 to the substrate 102. Examples of appropriate anneal temperature may vary with dopant type, as well as type of semiconductor material. Some examples of appropriate anneal temperatures for annealing silicon substrates are temperatures of greater than 800° C., such as 900° C. to 1000° C. Some examples of appropriate anneal temperatures for annealing semiconductor substrates other than silicon, such as group III-V compound semiconductor substrates, are temperatures of 600° C., 700° C., or greater. Annealing may take place via furnace annealing or using rapid thermal processing equipment, as known in the art. The duration of an activation anneal may vary according to the anneal temperature, for example, the duration may decrease with increased anneal temperature. Performing of a rapid thermal anneal may be especially useful to drive in and activate dopant, where the anneal time at a set temperature is less than 10 seconds. The embodiments are not limited in this context. For example, a rapid thermal anneal may be performed where the substrate is heated from room temperature to a target temperature at a target heating rate, where a rate of temperature increase is 50° C./s or greater. The embodiments are not limited in this context. In the case of silicon substrates, the target temperature for such a rapid thermal anneal may be 900° C., 950° C., or 1000° C. The embodiments are not limited in this context.

As schematically illustrated in FIG. 1F, the annealing at elevated temperature may generate diffusing dopant 128, shown by the downward arrows. The diffusing dopant 128 may diffuse into the altered layer 120. In addition, the diffusing dopant 128 may settle within certain sites within the crystalline lattice of the substrate 102. In particular, the diffusing dopant 128 may diffuse into active sites provided in the altered layer 120. As further shown in FIG. 1F, outdiffusing dopant 129 may diffuse outwardly toward the capping layer 124. The relative amount of the outdiffusing dopant 129 may differ from the amount of diffusing dopant 128. The relative amount of outdiffusing dopant may also vary with the composition of the capping layer 124. For example, arsenic may diffuse more rapidly into an oxide capping layer, while not diffusing as readily into a nitride capping layer.

In some embodiments, the operation of FIG. 1E may be omitted, where annealing as generally discussed with respect to FIG. IF takes place without a capping layer. In such cases, a portion of dopant in the doping layer 122 may evaporate from the substrate 102.

Figure 1G:
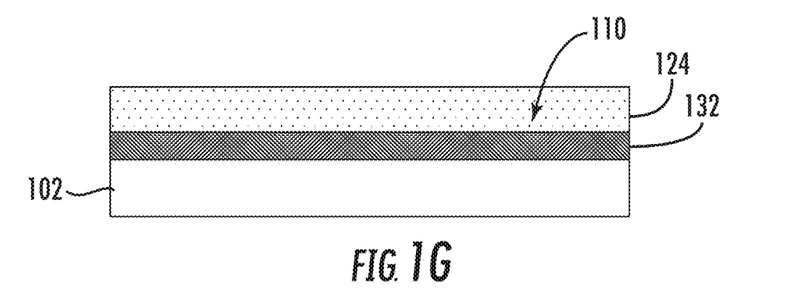
Figure 1H:
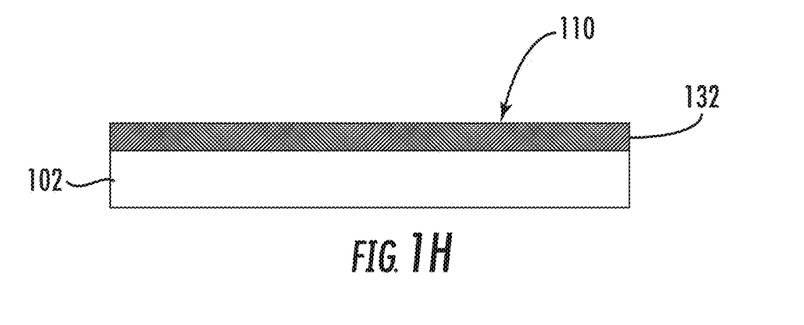

Turning now to FIG. 1G, there is shown a subsequent instance after the annealing operation of FIG. 1F. At this stage the substrate 102 includes a doped layer 132 adjacent the surface 110. The capping layer 124 may also retain some dopant. In a subsequent operation, shown in FIG. 1H, the capping layer 124 may be removed, for example, by a known selective etching process appropriate for the given material of the capping layer 124. A highly doped region, shown as the doped layer 132 may be in condition for further processing. For example, in embodiments where the doped layer 132 forms in a source/drain region, a metal contact, such as a silicide, may be subsequently formed to contact the substrate 102 in the region of the doped layer 132.

In accordance with various embodiments, the doped layer 132 may have a concentration of active dopants higher than the level achieved by known processing techniques. By providing a hot helium implant into the substrate 102 before driving dopants into the substrate 102, the altered layer 120 may promote diffusion of dopant across the interface formed at surface 110.

Figure 2:
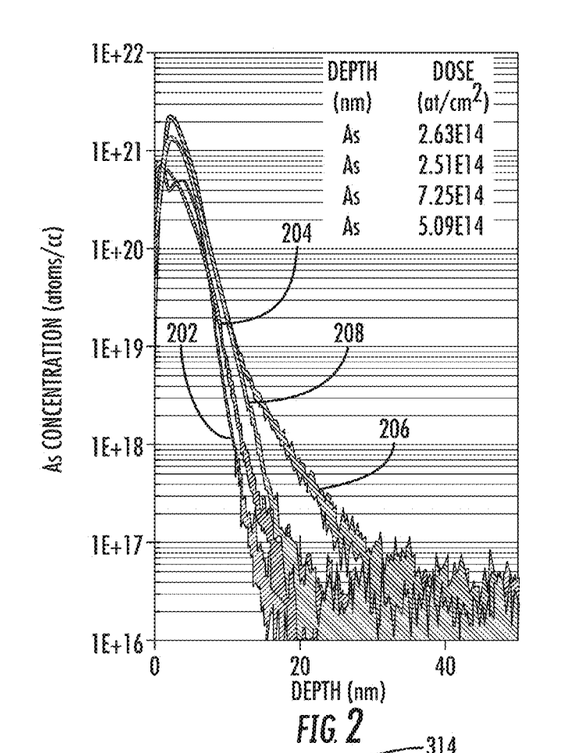
FIG. 2 shows the results of secondary ion mass spectrometry (SIMS) measurements of silicon substrates, illustrating the effect of helium implantation on dopant incorporation.

In exemplary experiments, the present inventors have discovered implantation conditions for preparing a substrate before introduction of dopants, where the implantation conditions substantially enhance diffusion of dopants across a substrate interface as well as activation of dopants, in comparison to known processing techniques. FIG. 2 shows the results of secondary ion mass spectrometry (SIMS) measurements of silicon substrates, illustrating the effect of helium implantation on dopant drive-in. A series of curves are shown representing depth profiles of As with respect to a surface of silicon (0 nm depth) for various different experimental conditions. In all examples, a <1 nm layer of As is deposited on a surface of monocrystalline silicon before a rapid thermal anneal is performed at 1000° C. for 5 s. Curve 204 represents a control condition where no helium is implanted into the substrate. As shown, the curve 204 shows a distribution of arsenic located close to the surface of the silicon. For example, the peak concentration is about 5 E20/cm$^2$ and the depth where the concentration reaches 1E18/cm$^2$ is approximately 13 nm. The total retained dose of arsenic in this example is 2.63E14/cm$^2$. The curve 202 represents the distribution of arsenic when a room temperature helium implant is performed to a dose of 1E15/cm$^2$ at an ion energy of 1 keV before deposition of arsenic and subsequent annealing. In this example, the depth at 1E18/cm$^2$ As concentration is 12 nm, while the total retained dose is 2.5E14/cm$^2$. This result indicates room temperature helium implantation at a level of 1E15/cm$^2$ is not effective in increasing arsenic diffusion into the substrate as compared to no implantation. The curve 206 represents the distribution of arsenic when helium is implanted at room temperature to a dose of 1E16/cm$^2$ before arsenic deposition and annealing. In this example, the implantation of helium results in a total retained dose of arsenic of 7.25 E14/cm$^2$ after annealing, a nearly 3-fold increase in retention as opposed to zero dose helium implantation or 1E15/cm$^2$ helium implantation. Disadvantageously, the curve 206 exhibits a tail at depths greater than 12 nm below the surface, where the tail has a shallower slope than in other cases. The concentration of As does not drop to 1E18/cm$^2$ until a depth of approximately 18 nm below the surface.

The curve 208 represents the As concentration after a helium implant is performed in accordance with embodiments of the disclosure. In this example, the helium is implanted at 450° C. to a dose of 1E16/cm2 before arsenic deposition and annealing. In this example, the implantation of hot helium results in a total retained dose of arsenic of 5.09 E14/cm$^2$ after annealing, a 2-fold increase in retention as opposed to zero dose helium implantation or 1E15/cm$^2$ helium implantation. The slope of concentration of As vs depth is similar to the curve 202 and curve 204, while the concentration reaches 1E18/cm2 at a depth of approximately 15 nm below the surface.

Sheet resistance measurements were additionally performed on the samples corresponding to curves 202-208 after implantation, arsenic deposition, and annealing. In the case of no helium implant corresponding to curve 204, the sheet resistance was too high register according to the surface probe measurement. In the case of room temperature helium implantation to a dose of 1E15/cm$^2$, corresponding to curve 202, the measured Rs is 22,000 Ohm/Sq. This resistance value is indicative of incomplete activation of the arsenic incorporated in the silicon substrate. In other words, for a retained arsenic dose of 2.5E14/cm$^2$, when a high fraction of the retained arsenic dose, such as 50% is activated, a sheet resistance substantially lower than 22,000 Ohm/Sq is expected. In the case of room temperature helium implantation to a dose of 1E16/cm$^2$, corresponding to curve 206, the measured Rs is 3,500 Ohm/Sq. This resistance value is also indicative of incomplete activation of the arsenic incorporated in the silicon substrate. In other words, for a retained arsenic dose of 7.25E14/cm$^2$, when a high fraction of the retained arsenic dose, such as 50% is activated, a sheet resistance substantially lower than 3,500 Ohm/Sq is expected. In the case of 450° C. helium implantation to a dose of 1E16/cm$^2$, corresponding to curve 208, the measured Rs is 300 Ohm/Sq. This resistance value is indicative of a much higher activation of the arsenic as compared with the sample corresponding to curve 306, where the same helium dose is implanted at room temperature. As a rough estimate for hot helium implantation at 1E16/cm$^2$ dose, the activation of Arsenic may be improved by approximately a factor of 10 or so with respect to the corresponding room temperature helium implantation. In particular, while the retained amount of arsenic after annealing is somewhat less (5E14/cm$^2$) as compared to a room temperature helium implantation dose of 1E16/cm² the resistance is reduced by a factor of 12. In various embodiments, an activation level of the dopant in the substrate may be at least five times more than a second activation level of the dopant in the substrate when the implant temperature is room temperature.

Figure 3A:
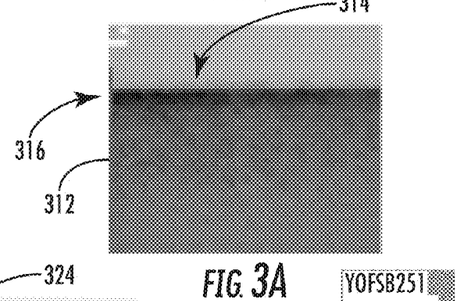
FIGS. 3A-3C present cross-sectional electron micrographs of samples illustrating the effect of helium ion implantation.
Figure 3B:
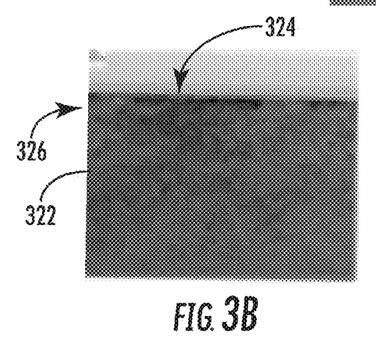
Figure 3C:
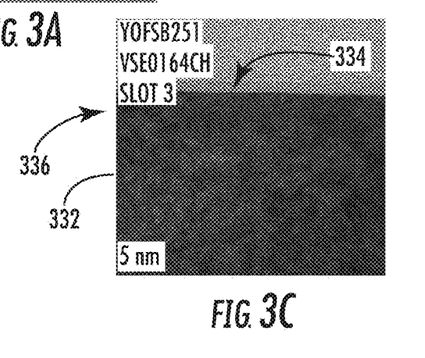

FIG. 3A, FIG. 3B, and FIG. 3C present cross-sectional electron micrographs of samples corresponding to curve 202, curve 206, and curve 208, respectively. As shown in FIG. 3A, where a substrate 312 is implanted with 1E15/cm² helium dose at room temperature before arsenic drive-in annealing, a high concentration of defects 316 (dark regions) is visible near the surface 314, where defects also extend further below the surface 314. In FIG. 3B, where the substrate 322 is implanted with 1E16/cm² helium dose at room temperature before arsenic drive-in, large size defects 326 are visible near the surface 324, with defects also extending further below the surface 324. In FIG. 3C, where the substrate 332 is implanted with 1E16/cm² helium dose at 450° C. before arsenic drive-in, no defects are visible in a region 336 near the surface 334. Additionally, the substrate 332 does not exhibit visible defects at distances further below the surface 334.

Without limitation as to any particular mechanism, the increased diffusion of dopant into the semiconductor substrate and improved activation of the dopant may be the result of a combination of features induced by hot helium implantation. For one, hot helium implantation may introduce vacancies within the semiconductor lattice of a monocrystalline semiconductor material such as silicon. At an appropriate temperature range, such as 300° C. to 500° C., and at helium implanted doses, such as the range of 5 E15/cm²-1E17/cm² at an ion energy in the range of 200 eV to 20 keV, a high concentration of vacancies may be introduced into the crystalline lattice just below a surface of the crystalline substrate without generating an amorphous region. These vacancies may act to increase diffusion of dopant into the crystalline lattice for thermally diffusing dopants, while also providing sites for activation of dopants.

By maintaining the substrate temperature at a sufficiently high level during implantation, formation of an amorphous layer may be avoided, even when the substrate is exposed to a large dose of helium, such as 1E16/cm² or more. As a non-limiting example, a dose of 1E17/cm² helium may be directed to a substrate at a temperature in excess of 450° C. At a substrate temperature of 450° C., after implantation with a dose of 1E17/cm² helium, while at a substrate temperature of 500° C., an estimated helium dose up to 2E17/cm² may be implanted into a substrate while not inducing residual damage. The avoidance of an amorphous layer as-implanted may also avoid unwanted defect formation occurring in substrates implanted at low temperature, after high temperature annealing is performed to drive in and activate dopant, and to recrystallize the amorphous regions. Recall from FIG. 2 and FIG. 3B where room temperature implantation of 1E16/cm² helium results in a relatively large amount of retained arsenic dopant (7.25 E14/cm²) after a drive-in anneal, while the samples show residual defects and much less activation of dopant than for samples implanted at 450° C. with the same does of helium.

Additionally, by maintaining the substrate temperature below a temperature range where defects are substantially annihilated, the benefits of vacancy creation in terms of enhanced diffusion and activation may be preserved. For example, when substrate temperature is maintained above 550° C. to 600° C., vacancies and interstitial defects may combine at a rapid rate during the high temperature implantation, resulting in a much lower number of residual vacancies present after the implantation process is complete.

Another feature of maintaining implantation temperature in a range of approximately 300° C. to 500° C. during helium implantation, is the ability to drive out helium dynamically during the implantation process. In this manner the concentration of helium remaining after high temperature implantation may be minimal.

Figure 4A:
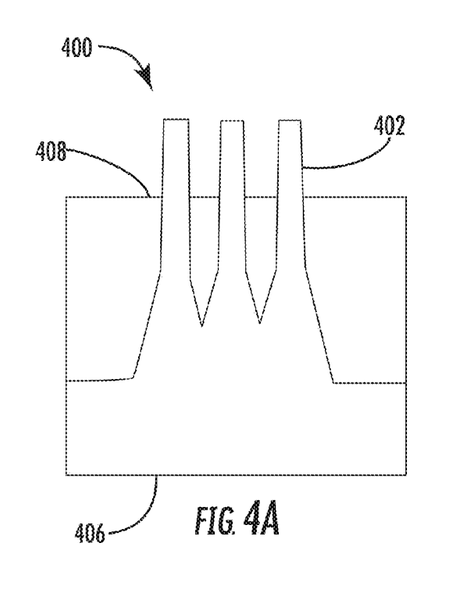
Figure 4B:
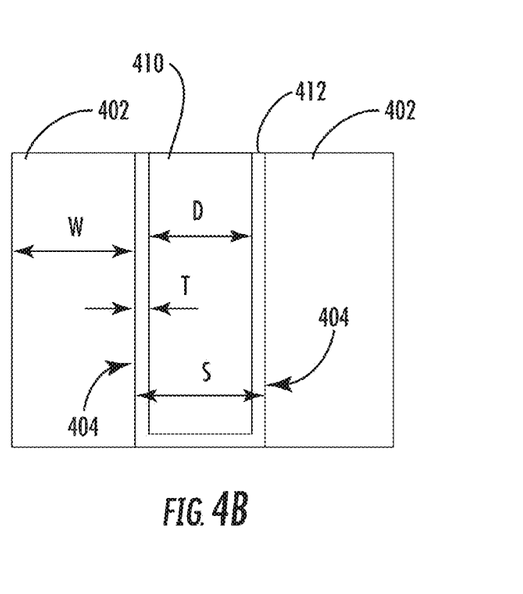
FIG. 4B shows a close-up of a portion of the structure of FIG. 4A according to embodiments of the disclosure.

In various embodiments, the operations generally outlined in FIGS. 1A-1H may be applied to improve contact resistance in a 3D device such as a finFET. FIG. 4A shows general features of a finFET device 400 in cross section, before a doping process for forming contact regions to a source/drain of the finFET. FIG. 4B shows a close-up of a portion of the structure of FIG. 4A at an instance generally corresponding to FIG. 1E. In particular, in FIG. 4A, fin structures shown as the fins 402 have been formed from a substrate base region 406 according to know techniques. Isolation 408 is also formed between fins 402, wherein just top portions of fins 402 are exposed. The top portions of the fins 402 may be used as source/drain regions to be contacted by a contact material, by introduction of an appropriate level of doping into the fins 402. For advanced technology nodes, such as nodes where the spacing between adjacent fin structures is 15 nm or less, doping by thermal diffusion of a deposited doping layer, such as a film containing a dopant, may be useful to avoid excessive defect formation created when using ion implantation to dope the fins. Accordingly, in accordance with embodiments of the disclosure, the operations of FIGS. 1A-1E may be applied to prepare the fins for doping.

A result of the improved activation and diffusion provided by high temperature helium implantation (see FIG. 1B) is the ability to use a thinner dopant layer to serve as a source of dopant for the fins. For example, a 0.1 nm arsenic layer may provide sufficient amount of arsenic to reach a target arsenic incorporation and dopant activation level for forming a low contact resistance contact in a narrow fin where the width W is 20 nm or less. This thinner layer of arsenic used in the present embodiment contrasts with known techniques performed without using a hot helium operation, where the known techniques may use an arsenic layer thickness in the range up to 2 nm, to compensate for less efficient activation of arsenic, as discussed above.

A consequence of the use of a thinner dopant layer afforded by the present embodiments, is the increased scalability of doping by diffusion from a dopant layer as the pitch between adjacent fins is reduced. For example, referring in particular to FIG. 4B, the annealing process for performing doping of a fin may specify a minimum thickness of a capping layer, such as 2 nm, to ensure proper drive-in of dopant and to keep dopant loss during annealing at an acceptable level. To use one example, the spacing S between the sidewalls 404 of adjacent fins, i.e, fins 402, may be 7 nm. As further shown in FIG. 4B, a doping layer 412 has formed on the sidewalls 404 of fins 402. The doping layer 412 is to be used as a doping source of the fins 402 by driving in dopants of the doping layer 412 across the surface of the sidewalls 404 and into the body of the fins 402. In one example, the doping layer 412 may be a layer of arsenic and the thickness T of the doping layer 412 may be 0.1 nm. Accordingly, a distance D separating adjacent dopant layers along the horizontal direction may be approximately 6.8 nm. In this scenario, a capping layer 410 having a thickness (along the horizontal direction) of 2 nm may readily be formed along two adjacent sidewalls, sidewalls 404. If the thickness T of doping layer 412 is specified to be 2 nm as in a conventional process, D is then 3 nm (=7 nm-2 nm-2 nm). In this latter scenario, forming a capping layer 410 of thickness 2 nm between two adjacent fin sidewalls may be problematic. Moreover, further scaling to smaller fin separation, such as 5 nm, may be precluded by the lack of space to accommodate 2 nm thick dopant layers and 2 nm thick capping layers.

In accordance with different embodiments, the process window for achieving enhanced dopant diffusion and activation using hot helium implantation may vary according to implantation ion energy, as well as substrate material. For example, the best implantation temperature for implanting helium may vary between silicon and silicon:germanium substrates. Moreover, while examples of arsenic doping are detailed herein, the present embodiments cover doping using other dopant materials including p-type dopants such as boron.

Figure 5:
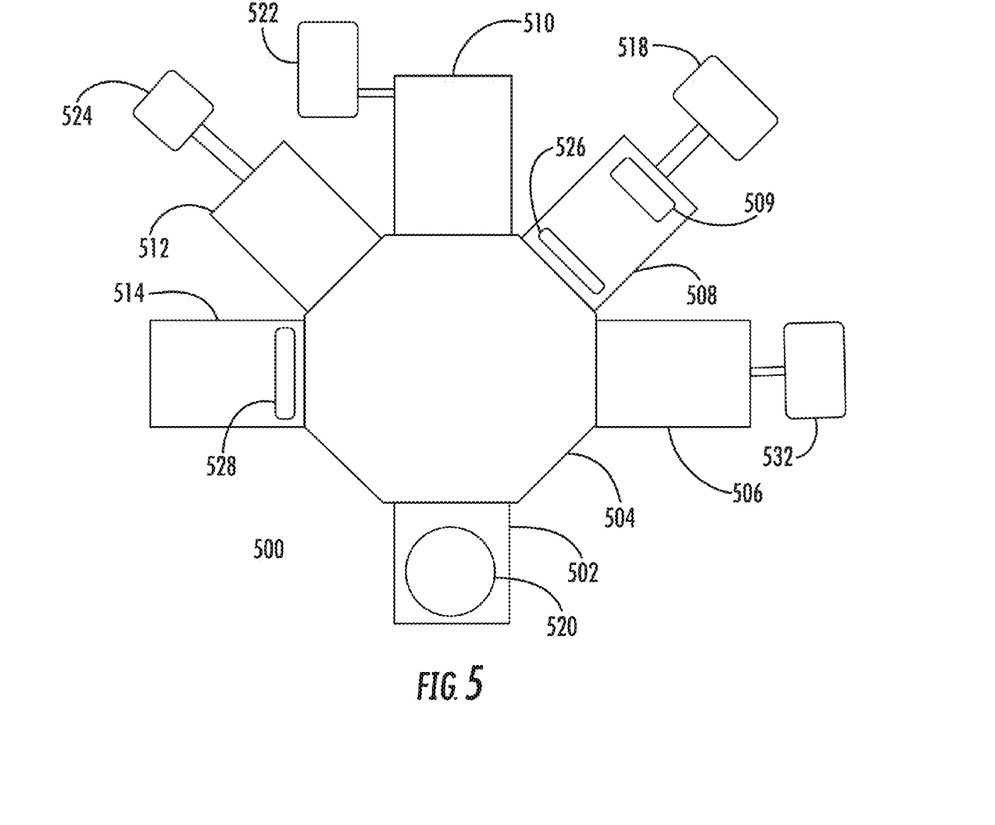
FIG. 5 depicts an example of a processing apparatus according to embodiments of the disclosure.

FIG. 5 depicts an example of a processing apparatus, shown as the system 500, according to embodiments of the disclosure. FIG. 5 in particular presents a top plan view (X-Y plane) of the system 500. The system 500 may be especially useful or dedicated for performing a substrate doping process employing helium implantation at elevated temperatures as disclosed hereinabove. The system 500 may be configured as a cluster tool, including a load lock 502 and transfer chamber 504 to transport substrates 520 to various processing chambers. An advantage of using a cluster tool to perform multiple operations is the avoidance of breaking vacuum between operations, meaning substrates are not exposed to ambient atmosphere (outside the cluster tool) between operations, where the individual operations may be performed under vacuum, under low pressure, or under controlled pressures of designated gases. The system 500 may include an etch chamber 506 to perform substrate cleaning, such as removing a native oxide layer. The etch chamber 506 may be coupled to a gaseous etchant source 532, where the etch chamber 506 generates a high temperature plasma etch species to etch material from the substrate, or employs other gaseous etchant to etch the substrate in some embodiments. Examples of a plasma etch species include hydrogen, $NF_3$, $Cl_2$, and other known active etch chemistries, especially useful for etching oxides.

The system 500 may further include a hot implant chamber 508 coupled to a helium source 518. In various embodiments the hot implant chamber 508 may provide a helium plasma generating helium ions of an appropriate energy for implantation into the substrate 520. The hot implant chamber 508 may include a known plasma generator such as an RF (radio frequency) coil, and may be configured as a plasma immersion system in some embodiments. In other embodiments the hot implant chamber 508 may be configured with a separate plasma chamber generating a plasma, and having an extraction system forming an ion beam, where the ion beam is directed to the substrate 520. The hot implant chamber 508 may include any appropriate heater, shown as heater 526, such as a radiative heater, resistance heater, induction heater, or other heater.

The system 500 may also include a dopant deposition chamber 510 coupled to a dopant source 522, where dopant deposition is carried out by chemical vapor deposition processes arranged according to known techniques. The system 500 may also include a capping layer chamber 512 coupled to a capping material source 524, where a process for depositing a capping layer such as silicon nitride is performed. Appropriate processes for capping layer chamber 512 may be CVD plasma CVD, physical vapor deposition, or other deposition technique. Examples of a capping layer source include a liquid or gas source(s) providing the appropriate material (e.g. Si, N) or a solid target material providing the appropriate material. The system 500 may also include an annealing chamber 514 having a heater 528, where high temperature annealing, such as annealing above 800° C., is carried out. In some examples, the annealing chamber 514 may be configured for rapid thermal annealing by using lamps or other appropriate components. During a doping process, the substrate 520 may be transferred between the various process chambers of the system 500 via transfer chamber 504 without being exposed to outside ambient.

Figure 6:
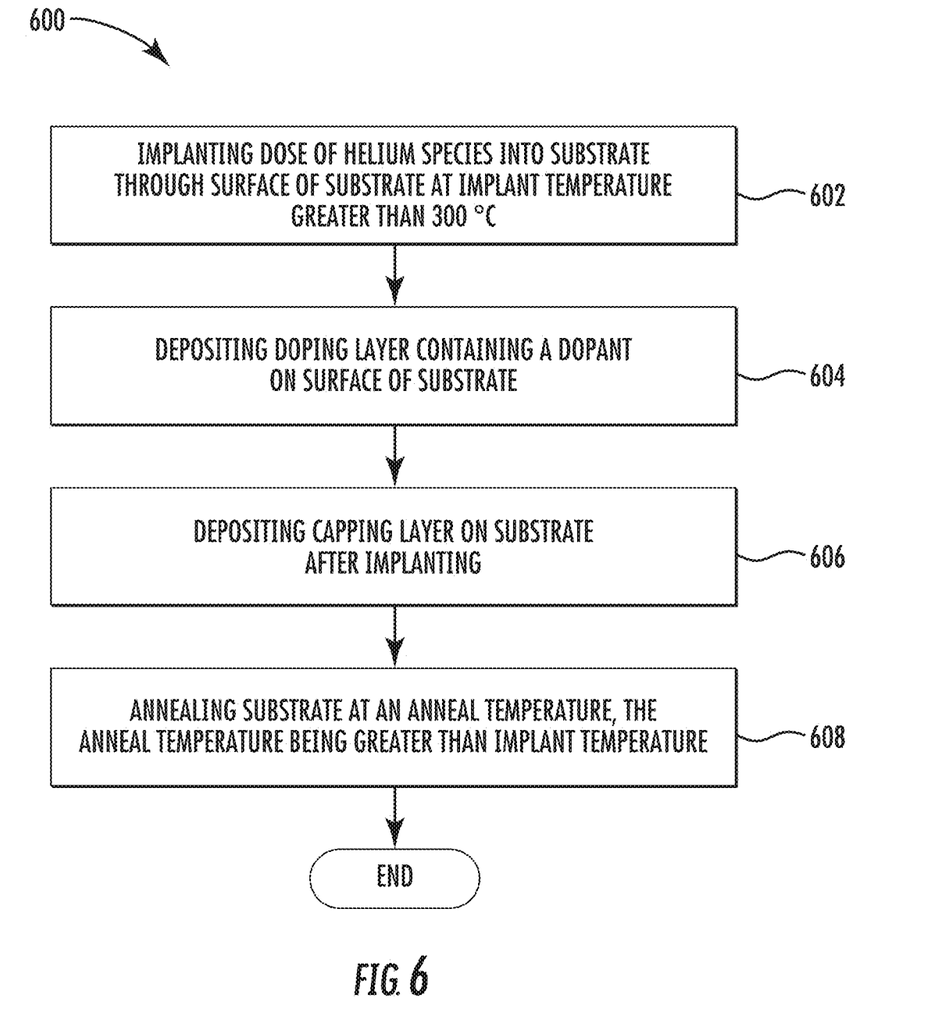
FIG. 6 depicts an exemplary process flow.

FIG. 6 depicts an exemplary process flow 600 according to embodiments of the disclosure. At block 602 the operation is performed of implanting a dose of helium species into substrate through surface of substrate at implant temperature greater than 300° C. In particular embodiments, the implant temperature may range between 400° C. and 500° C.

At block 604, the operation is performed of depositing a doping layer containing a dopant on the surface of the substrate. In some embodiments a thickness of the doping layer may range between 0.1 nm and 3 nm. At block 606 the operation is performed of depositing a capping layer on the substrate after the implanting. At block 608, the operation is performed of annealing the substrate at an anneal temperature, where the anneal temperature is greater than the implant temperature. Examples of appropriate anneal temperature include the range of 800° C. to 1000° C. In some embodiments, the anneal temperature may represent the peak temperature of a rapid thermal anneal process where the duration at peak is less than 10 seconds and in some cases 1 second or less.

The present embodiments provide the advantage of a technique to increase dopant diffusion into a substrate from a deposited layer, while not amorphizing a substrate being implanted. This avoidance of amorphizing the substrate may lead to the further advantage of increased activation of dopant after annealing is performed. The present embodiments also provide the further advantage of scalability of doping processes using deposited layers in non-planar devices, such as finFETs.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, while the present disclosure has been described herein in the context of a particular implementation in a particular environment for a particular purpose, those of ordinary skill in the art will recognize the usefulness of the present embodiments is not limited thereto and the present embodiments may be beneficially implemented in any number of environments for any number of purposes. Thus, the claims set forth below are to be construed in view of the full breadth and spirit of the present disclosure as described herein.

What is claimed is:

1. A method of doping a substrate, comprising:
   implanting a dose of a helium species into the substrate through a surface of the substrate at an implant temperature of greater than 350° C.;
   depositing a doping layer containing a dopant on the surface of the substrate; and
   annealing the substrate at an anneal temperature, the anneal temperature being greater than the implant temperature, wherein a first activation level of the dopant in the substrate is greater than a second activation level of the dopant in the substrate when the substrate is implanted at an implant temperature of room temperature.

2. The method of claim 1, wherein the implant temperature is less than 550° C.

3. The method of claim 1, wherein the helium species comprise an energy of 200 eV to 5000 eV.

4. The method of claim 1, wherein the dose of helium species comprises a dose of $5E15/cm^2$ to $1E17/cm^2$ He.

5. The method of claim 1, wherein the doping layer comprises a thickness between 0.1 nm and 3 nm.

6. The method of claim 1, wherein the dopant comprises a film containing arsenic, boron, phosphorous, or silicon.

7. The method of claim 1, wherein the substrate comprises one of: silicon, germanium, silicon carbide (SiC), silicon:germanium alloy, a III-V compound semiconductor or II-VI compound semiconductor.

8. The method of claim 1, wherein the depositing the doping layer takes place before the implanting.

9. The method of claim 1, wherein the annealing the substrate comprises performing a rapid thermal anneal, wherein a rate of temperature increase is greater than 50° C./s, wherein an anneal temperature is greater than 900° C., and wherein an anneal time is less than 10 seconds.

10. The method of claim 1, wherein operations including the depositing, the implanting, and the annealing take place in a cluster tool without breaking vacuum between operations, the method further comprising:
    removing an oxide layer before the implanting and before the depositing; and
    depositing a capping layer on the substrate after the implanting and after the depositing and before the annealing, wherein the removing and the depositing are further performed in the cluster tool without breaking vacuum between operations.

11. The method of claim 1, wherein the substrate comprises at least one fin structure of a finFET, wherein a spacing between a first fin structure and an adjacent fin structure of the finFET is less than 10 nm.

12. The method of claim 11, wherein the doping layer comprises a thickness of 1 nm or less.

13. The method of claim 1, wherein a diffusion of the doping layer is enhanced in comparison to when the substrate is not implanted with helium.

14. A method of doping a semiconductor device, comprising:
    implanting a dose of helium into a substrate through a surface of the substrate at an implant temperature above 350° C., the dose of helium comprising $5E15/cm^2$ or greater;
    depositing a doping layer containing a dopant on the surface of the substrate, the doping layer having a thickness less than 1 nm; and
    annealing the substrate at an anneal temperature greater than 600° C., wherein a first activation level of the dopant in the substrate is greater than a second activation level of the dopant in the substrate when the substrate is implanted at an implant temperature of room temperature.

15. The method of claim 14, wherein the doping layer comprises a layer of arsenic and the substrate comprises silicon, germanium, or silicon:germanium alloy, a III-V compound semiconductor or II-VI compound semiconductor.

16. The method of claim 15, wherein the first activation level of the dopant in the substrate is at least five times more than the second activation level of the dopant in the substrate.

17. The method of claim 14, further comprising:
    removing an oxide layer before the implanting and before the depositing; and
    depositing a capping layer on the doping layer before the annealing.

18. The method of claim 17, wherein the substrate comprises a fin-type transistor device, wherein a spacing between adjacent fin structures of the fin-type transistor device is less than 10 nm, and wherein a thickness of the doping layer is 0.5 nm or less.

* * * * *